United States Patent [19]
Rand et al.

[11] Patent Number: 5,266,125
[45] Date of Patent: Nov. 30, 1993

[54] INTERCONNECTED SILICON FILM SOLAR CELL ARRAY

[75] Inventors: James A. Rand, Oxford, Pa.; Allen M. Barnett; Robert B. Hall, both of Newark, Del.

[73] Assignee: AstroPower, Inc., Newark, Del.

[21] Appl. No.: 881,602

[22] Filed: May 12, 1992

[51] Int. Cl.[5] .................... H01L 31/042; H01L 31/05
[52] U.S. Cl. .................................. 136/244; 257/443; 257/448; 437/2; 136/255
[58] Field of Search ............... 136/244, 249 MS, 255; 257/443, 448

[56] References Cited

U.S. PATENT DOCUMENTS

| | | | |
|---|---|---|---|
| 3,546,542 | 12/1970 | Riel et al. | 136/249 MS |
| 3,653,971 | 4/1972 | Lidorenko et al. | 136/244 |
| 3,994,012 | 11/1976 | Warner, Jr. | 136/246 |
| 4,190,852 | 2/1980 | Warner, Jr. | 136/249 MS |
| 4,200,472 | 4/1980 | Chappell | 136/246 |
| 4,612,408 | 9/1986 | Moddell et al. | 136/244 |
| 4,645,866 | 2/1987 | Nitta | 136/244 |
| 4,879,251 | 11/1989 | Kruehler et al. | 437/4 |
| 4,933,021 | 6/1990 | Swanson | 136/249 MS |
| 4,933,022 | 6/1990 | Swanson | 136/249 MS |
| 4,935,067 | 6/1990 | Sato et al. | 136/255 |
| 5,057,163 | 10/1991 | Barnett et al. | 136/258 PC |

*Primary Examiner*—Aaron Weisstuch
*Attorney, Agent, or Firm*—Ratner & Prestia

[57] ABSTRACT

A plurality of thin polycrystalline silicon solar cells formed on a ceramic substrate and which are electrically series connected to form a monolithically interconnected submodule. Adjacent solar cells are electrically separated by a vertical trench and electrically connected by interconnects located below the light receiving surface of each solar cell. The submodules are provided with external electrical contacts for electrically connecting into a photovoltaic module assembly.

31 Claims, 3 Drawing Sheets

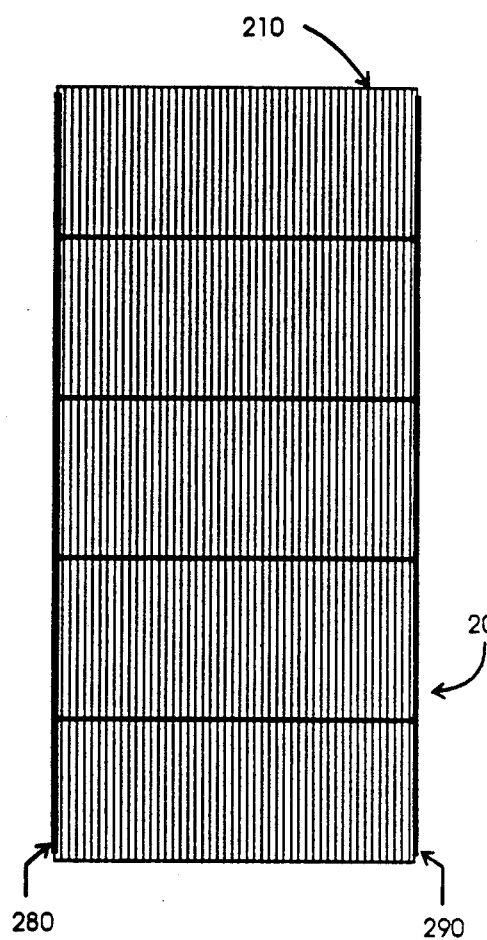
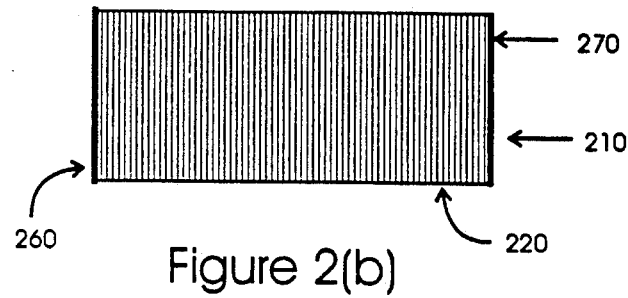
Figure 2(b)
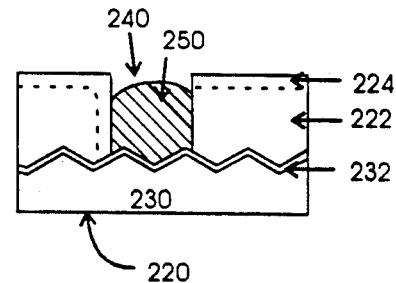
Figure 2(c)
Figure 2(a)
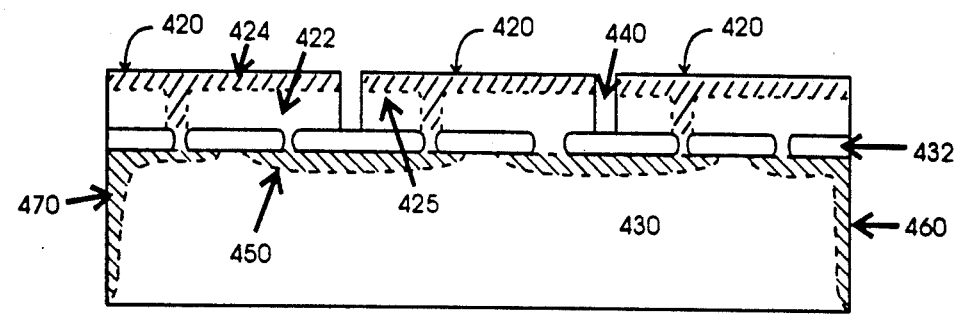
Figure 4

INTERCONNECTED SILICON FILM SOLAR CELL ARRAY

FIELD OF THE INVENTION

This invention relates to the field of art of photovoltaic modules for the conversion of sunlight into electricity comprising an assembly of submodules wherein, a plurality of polycrystalline thin-film semiconductor solar cells on a substrate are monolithically arranged and connected in series and a method of fabricating such devices.

BACKGROUND OF THE INVENTION

Photovoltaic solar cells are semiconductor devices which convert sunlight into electricity. Solar cells which utilize crystalline semiconductors, such as silicon, offer the advantages of high performance and reliability. Until recently, expanded utilization of crystalline silicon solar cells has been limited by the high cost of the solar cells. Significant reductions in the cost of solar cells can be achieved by using thin-film solar cells such as the "SILICON-FILM" cell described by A. M. Barnett et al in U.S. Pat. No. 5,057,163, which is incorporated by reference herein.

As pointed out by Warner in U.S. Pat. No. 3,994,012, which issued Nov. 23, 1976 and is incorporated by reference herein, it has been generally recognized that a plurality of individual silicon solar cells must be connected in series in order to produce a photovoltaic module having the desired output voltage. Present technology of silicon module assembly involves stringing together of as many as 36 individual solar cells. Furthermore, present approaches require that electrical contacts be made to opposite sides of each solar cell. As further noted by Warner, some of these difficulties can be overcome by configuring a monolithic array of solar cells. However, monolithic designs known in the art are generally expensive to manufacture, are expected to reduce power output due to losses in active area and are not useful with thin crystalline silicon solar cells. These characteristics, when combined with the high cost of conventional thick crystalline silicon solar cells, contribute to the cost and performance limitations that inhibit utilization of silicon photovoltaic modules on a wider scale. Accordingly, there is a need for a monolithic photovoltaic module made up of submodules formed from thin crystalline silicon solar cells which are connected in series on a single substrate.

SUMMARY OF THE INVENTION

An object of this invention is to provide a monolithically integrated series connected thin polycrystalline silicon solar cell sub-module.

A further object of this invention is to provide a monolithically integrated series connected thin polycrystalline silicon solar cell sub-module having no external electrical contacts on the illuminated surface of the cells.

A still further object of this invention is provide a photovoltaic module utilizing monolithically integrated thin polycrystalline silicon solar cell submodules and having reduced cost through decreased device and assembly costs.

The objects of this invention are achieved by a photovoltaic device including a plurality of solar cells formed on a ceramic substrate and which are electrically series connected to form a monolithically interconnected submodule, each of said solar cells being thin polycrystalline silicon formed over the substrate and each solar cell comprising oppositely doped layers, and each pair of adjacent solar cells being electrically separated by a vertical trench and electrically connected by interconnects between oppositely doped layers of the adjacent cells, said contact means being located below the light receiving surface of each solar cell, and said submodule having external electrical contact means provided for electrically connecting said submodule assembly into a photovoltaic module assembly. In a preferred embodiment, a barrier layer is provided between the substrate and the

BRIEF DESCRIPTION OF THE DRAWINGS

FIG. 2(a), 2(b) and 2(c) illustrate a schematic diagram of a photovoltaic module assembly of submodules and showing in detail the interconnection of solar cells within a submodule in accord with this invention.

FIG. 4 is a schematic diagram of a photovoltaic submodule in accord with this invention, showing a plurality of series connected solar cells formed over a barrier layer on a ceramic substrate wherein the cells are interconnected below the barrier layer.

DETAILED DESCRIPTION OF THE DRAWINGS

Figure 1:
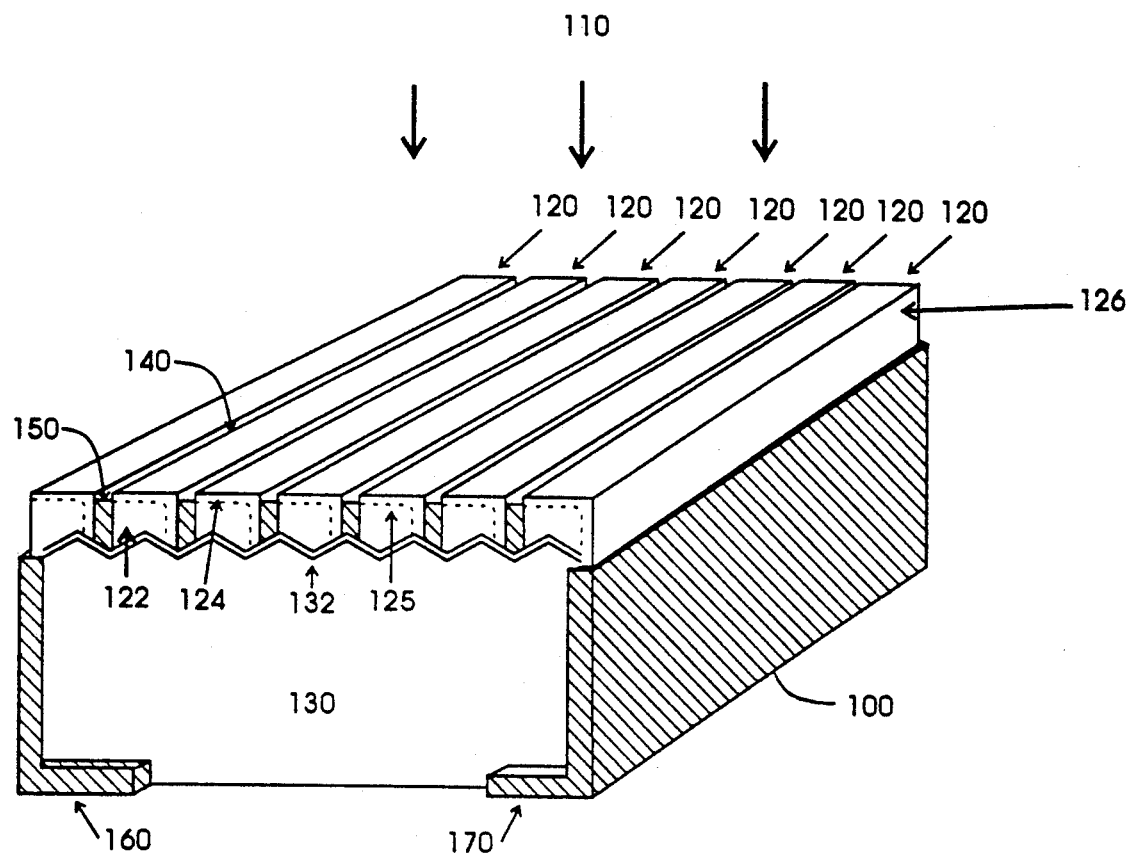
FIG. 1 is a schematic diagram of a photovoltaic submodule in accord with this invention, showing a plurality of series connected solar cells formed over a barrier layer on a ceramic substrate wherein the cells are interconnected above the barrier layer.

A photovoltaic submodule in accord with the teachings of this invention is illustrated in FIG. 1. Submodule 100 is comprised of cells 120 formed on substrate 130. Each cell is made up of semiconductor layers having opposite conductivity type, 122 and 124, and forming a rectifying junction 125 therebetween. The cells are separated from each other by trenches 140. Metallic interconnects 150 located in the trenches connect each cell to its neighbor in a series fashion. Electrically, the submodule illustrated in FIG. 1 represents seven cells in series, although more or fewer cells may be used depending on the desired output current-voltage characteristics for the submodule in a particular application. Contacts 160 and 170 are located on the sides or back of the submodule and provide means for electrically connecting the submodule.

Referring to FIG. 2(a), 2(b) and 2(c) submodules 210 are assembled into a module 200. Each submodule is made up of a plurality of cells 220 formed on substrate 230. The cells are isolated by trenches 240 and are electrically connected in series with neighboring cells by metal interconnects 250. The submodules are electrically connected with each other via contacts 260 and 270. External contacts 280 and 290 which are located on the sides or back of the module are used to electrically connect the module to the photovoltaic power generating system as desired.

When the submodules are connected in parallel, the open circuit voltage of a module is determined by the number of cells in a submodule. The short circuit current is determined by the active area of each cell and the number of submodules. For example, present day commercial photovoltaic power generation systems utilize modules which have a peak output of 45 watts. Accordingly, the module of this invention would be made up of nine or fewer submodules each having an area of 400 cm$^2$ and each containing 36 cells connected in series.

Returning to FIG. 1, substrate 130 is formed from a ceramic material such as the conducting ceramic described in aforementioned U.S. Pat. No. 5,057,163 or an insulating ceramic comprised of inorganic oxides, carbides, nitrides, borides, silicates and mixtures thereof. In either case, the ceramic substrate is selected in accord with the teachings of U.S. Pat. No. 5,057,163 to have a thermal expansion coefficient that is matched to silicon and is preferably textured to provide for diffuse reflection of light and optical confinement. An insulating ceramic formed from alumina ($Al_2O_3$) is preferred. Covering the top surface of the substrate is barrier layer 132 which functions in accord with the teachings of the aforementioned U.S. Pat. No. 5,057,163. When the substrate is electrically conducting, the barrier layer must be electrically insulating. However, it is preferred that the substrate be electrically insulating or highly resistive with a resistivity greater than 500 ohm-centimeter, in which case the barrier layer may be insulating, conducting or omitted entirely. As taught in the aforementioned U.S. Pat. No. 5,057,163, the barrier layer is selected to: provide for strength at temperatures required for fabrication of the solar cell; act as a barrier to diffusion of impurities from the substrate into the active semiconductor layers of the solar cells; passivate the interface between the barrier layer and the active semiconductor in order to minimize surface recombination of photo-generated carriers and injected minority carriers; and be made reflective preferably by either having an index of refraction that is different from that of the active semiconductor in order to provide a reflective surface for optical confinement or by combining, in a medium, two materials having different indices of refraction. Suitable insulating barrier layers include a layer of silicon dioxide, a layer of silicon nitride, a layer of aluminum oxide or a multi-layer barrier comprising a layer of silicon dioxide plus a layer of titanium boride, titanium oxide or aluminum oxide. A conducting barrier layer comprised of titanium boride may be used in conjunction with an insulating substrate. A silicon dioxide barrier layer having a thickness of 0.4 micron is preferred. The upper surface of the barrier layer may also be textured to provide for diffuse reflection of light and optical confinement. A textured substrate with an essentially conformal barrier layer is preferred.

Over the barrier layer are a plurality of cells 120 which are semiconductor layers comprised of contiguous regions of opposite first and second conductivity types, 122 and 124. Light 110 enters each cell through the upper, light receiving surface 126 of region 124. The lower surface of region 122 is formed over the barrier layer 132. Region 124 covers the entire top surface of region 122 forming a horizontal photovoltaic junction which is essentially parallel to the plane of the substrate and normal the direction of incoming light. Region 124 also extends vertically along one side of the cell to the barrier layer 132 such that vertical regions of adjacent cells are of opposite conductivity type. In a preferred embodiment of this invention, the semiconductor layers are polycrystalline thin-films of silicon between 5 and 200 microns thick and preferably 30 microns thick. As taught in the aforementioned U.S. Pat. No. 5,057,163, the grain diameter of the polycrystalline silicon should be at least twice the film thickness. Region 122, which functions as the base region, is p-type silicon that is 5 to 200 microns thick and is doped to have a p-type carrier concentration of $1 \times 10^{15}$ cm$^{-3}$ to $2 \times 10^{17}$ cm$^{-3}$ and is characterized by a minority carrier diffusion length of least twice the thickness. Region 124, which functions as an emitter, is thin—typically 0.2 micron thick- and doped to an n-type carrier concentration of $1 \times 10^{19}$ cm$^{-3}$, and forms p-n junction 125 with the base. Antireflection and surface passivation coatings, all known in the art, may also be applied to the cells in order to increase the performance of photovoltaic submodules and modules of this invention.

The cells are separated from each other by vertical trenches 140, which are preferably parallel, equally spaced and extend horizontally across one full dimension of the submodule and vertically to the barrier layer; except in cases when the substrate is insulating wherein the trenches can extend vertically to or into the substrate. The width of the trenches is selected to insure electrical isolation, minimize loss in active area and maximize high process yield. In general, a trench width of 10 to 50 microns is satisfactory and a width of 30 microns is preferred.

The spacings of the trenches determine the width of each cell, which, for a given substrate width sets the number of cells and maximum output voltage of the submodule. Trench width and spacing also determine active area and series resistance, thereby influencing the maximum power that can be generated. Procedures for selecting trench width and spacing for optimum power output are well known in the art. Interconnects 150 are located in the trenches and provide for electrical series connection between adjacent cells. The interconnects may extend the entire length of a trench or may be spaced apart within a trench. In any event, each interconnect spans the width of each trench and is in contact with the oppositely doped regions of neighboring cells. The height of each interconnect is selected to provide for sufficient contact area to minimize resistance losses; but should not be so great as to make probable the short-circuiting of a cell which would occur if the interconnect contacts similarly doped regions of neighboring cells or if the interconnect contacts oppositely doped regions of the same cell. It is preferred that the interconnects be a metal or metal alloy, although highly electrically conductive materials such as heavily doped semiconductors and semi-metals may be employed. In addition, conductive organic compounds, such as a conductive epoxy containing silver, may be included. In addition to high conductivity, the interconnect material must make ohmic contact with both doped regions of the cells and be durable over the lifetime of a module which, in some cases may be as much as 30 years or longer. Metals selected from aluminum, nickel, palladium, silver, titanium and combinations thereof are suitable materials for the interconnect. Silver is preferred.

External contacts 160 and 170, which extend the length of the submodule and are parallel to the cells, are applied to the exposed oppositely doped regions of cells located on opposing sides of the submodule. Contacts 160 and 170 may also continue in wrap-around fashion to the back of the submodule. Contacts 160 and 170 are metallic materials selected to form ohmic contact with the respective oppositely doped regions of the cells. The contact materials must also provide for low electrical resistance connections of submodules in the module and durability. Metals selected from aluminum, nickel, palladium, silver, titanium and combinations thereof are suitable materials for the external contacts. Silver is preferred.

Photovoltaic modules according to this invention may be fabricated to meet the requirements of a variety of applications. For example, the following table summarizes the features of but three modules designs contemplated by this invention.

|   | MODULE | | SUB MODULE | | | CELL | | OUTPUT | | |
|---|---|---|---|---|---|---|---|---|---|---|
|   | W (cm) | L (cm) | # | W (cm) | L (cm) | # | W (cm) | $V_{oc}$ (V) | $I_{sc}$ (A) | $P_{max}$ (W) |
| A | 40 | 100 | 5 | 40 | 20 | 36 | 1.1 | 20 | 2.6 | 40 |
| B | 20 | 200 | 5 | 20 | 40 | 36 | 0.5 | 20 | 2.6 | 40 |
| C | 40 | 100 | 5 | 40 | 20 | 72 | 0.5 | 40 | 1.3 | 40 |

Module design designated A, which retains the standard size and current-voltage characteristics would be favored as a lower cost replacement for current commercially available photovoltaic modules. Module design designated B, with an elongated shape and an open circuit voltage of 20V, are useful for 12 volt battery chargers. The final example, C, features low current and high voltage in a standard module size and is preferred for power applications such as residential, commercial and utility grid-connected generation systems.

Figure 3:
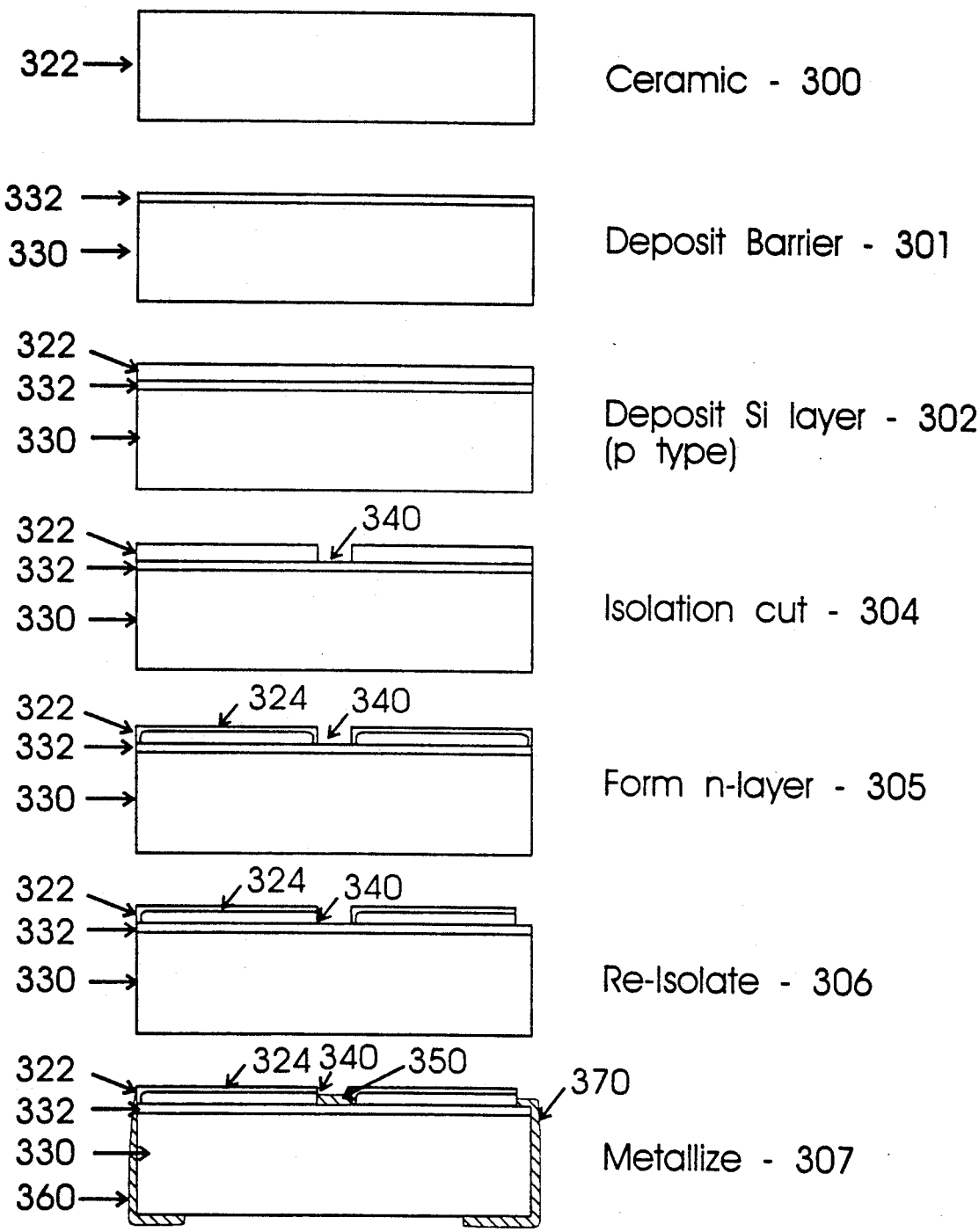
FIG. 3 is a block diagram of a process sequence for fabricating a submodule in accord with this invention.

A process for fabricating a submodule according to this invention is illustrated in FIG. 3. In step 300 a ceramic substrate 330 is prepared following the teachings of the aforementioned U.S. Pat. No. 5,057,163. Although not shown, step 300 preferably includes texturing the surface of the substrate. Next, step 301 barrier layer 332 is applied over the substrate following procedures set forth in the aforementioned patent. Over the barrier layer, p-type polycrystalline silicon layer 322 is formed in step 303 which is carried out following the teachings of the aforementioned patent. Trenches 340, of which only one is shown for simplicity, are formed in isolation cut step 304 using laser, mechanical or chemical scribing techniques known in the art. Laser scribing of silicon which is well known in the art is preferred for step 304. In step 305 a layer of n-type silicon 324 is formed on the exposed horizontal and vertical surfaces of the p-type layer 322. N-type layer 324 is preferably formed by diffusion of n-type dopant phosphorus form a gaseous source such as phosphine using techniques which are well established in the art of silicon semiconductor technology. In order to provide for series connection between cells, re-isolation step 306 is performed to selectively remove a small portion of the silicon on one side of each trench 340, leaving a vertical surface of p-type silicon spaced apart form an n-type vertical surface by the trench. Re-isolation step 306 is preferably performed using a laser to selectively widen the trenches by an amount at least equal to the thickness of n-layer 324. Etching steps may also be required before n-layer formation step 305 and after re-isolation step 306 to remove silicon that had been melted by the laser and splattered onto the surface of the semiconductor. Fabrication of a submodule in accord with this invention is completed in metalization step 307 wherein, preferably, electroless plating is used to selectively apply nickel into the trenches to form interconnects 350 and onto opposing outer vertical sides of oppositely doped silicon to form external contacts 360 and 370. Alternative to the preferred electroless plating, step 307 includes screen printing to selectively apply silver metal into the trenches to form interconnects 350 and onto opposing vertical sides of oppositely doped silicon to form external contacts 360 and 370. It is preferred that contacts 360 and 370 also continue on the sides and back of substrate and this may be carried out in subsequent, though not shown, steps. It is understood that when screen printing is used, metalization step 307 also includes the steps of drying and firing, all of which are known in the art.

Referring to FIG. 4, a photovoltaic submodule in accord with this invention wherein the cells are connected in series fashion below the barrier is illustrated. Submodule 400 is formed on substrate 430, which is of high electrical resistivity material, preferably the insulating ceramic material described above. Substrate 430 contains conducting regions 450 which intersect the upper surface of the substrate. Conducting regions 450, which are below barrier layer 432, are arranged in a patterned array, function as interconnects for electrically connecting in series a plurality of cells 420 that are formed over the barrier layer. Cells 420 are comprised of oppositely doped semiconductor regions 422 and 424. Interconnects 450 are generally selected to provide for low resistance electrical connection between cells and are preferably selected for low resistance ohmic contact to semiconductor regions 422 and 424. Materials such as heavily doped silicon and high melting point metals are suitable for forming the interconnects 450 and doped silicon is preferred. Interconnects 450 are formed on the substrate by processes such as screen printing, or deposition followed by photolithographic patterning and etching or selective deposition, all of which are known in the art. Screen printing is preferred for forming the interconnects 450. The conducting regions which comprise interconnects 450 extend to a depth into the substrate that is sufficient to provide low electrical resistance interconnects in accord with the teachings of this invention. The conducting regions are preferably arranged as elongated stripes which extend the entire length of the substrate and are spaced at regular intervals along the substrate width. Conducting regions of interconnects 450 are also located at the opposing ends of the substrate width and, as shown, continue along the sides and a portion of the back of the substrate to provide for external electrical contacts 460 and 470.

The spacing and width of each conducting region are determined by the number of cells to be connected in series on the substrate. Barrier layer 432 found in submodule 400 of this embodiment is selected as set forth above. Likewise, textured surfaces of the substrate and barrier layer to provide for diffuse reflections and optical confinement are preferred for submodule 400, as well.

Over the barrier layer are a plurality of cells 420 which are semiconductor layers comprised of contiguous regions of opposite first and second conductivity types, 422 and 424, with 422 formed over the barrier layer. Region 424 covers the entire top surface of region 422 forming a horizontal photovoltaic junction 425 which is essentially parallel to the plane of the substrate and normal the direction of incoming light. The semiconductor materials, thicknesses and design features of cells 420 are selected in the manner set forth above in accord with the teaching of this invention.

Region 424 is also in selective electrical communication with interconnects 450 at contact regions 455. Contact regions 455 are preferably the same material as doped semiconductor 424, although conducting and semiconducting materials which make ohmic contact to semiconductor 424 and rectifying contact with semiconductor 422 are suitable. Contact region 455 of each cell is preferably a patterned array, although a single continuous area, such as a stripe, may be employed. The area occupied by the contact region 455 is selected to minimize losses due to active area and series resistance. Suitable methods for forming contact regions 455 include selective etching followed by selective deposition or laser ablation followed by an n-type diffusion. The method of laser ablation is preferred for forming contact regions 455 in accord with this invention.

The cells are separated from each other by vertical trenches 440, which are preferably parallel, equally spaced and extend horizontally across one full dimension of the submodule and vertically at least to the barrier layer. Trenches 440 are located over conducting interconnecting regions 450 as shown in FIG. 4 to allow for neighboring cells to be interconnected electrically in series. The dimensions of trenches 440 are selected in accord with this invention in the manner set forth above.

External contacts 460 and 470, which extend the length of the submodule and are parallel to the cells, are applied to exposed contact regions 450 located on opposing sides of the submodule. Contacts 460 and 470 are selected in the manner set forth above in accord with the teachings of this invention.

Other modifications of the teachings of this invention, such as, monolithic integration of a silicon blocking diode within each submodule and utilization of other substrate, barrier, semiconductor, interconnect and barrier materials will be apparent to those skilled in the art and must fall within the scope of the following claims.

What is claimed is:

1. A photovoltaic device having solar cells which are electrically series connected to form a monolithically interconnected submodule, comprising:
  a. a ceramic substrate;
  b. a plurality of solar cells formed over the substrate, each cell having a light receiving surface and comprising oppositely doped regions of semiconductor materials which includes a first doped region of semiconductor material and a second doped region of semiconductor material doped oppositely to said first doped region, said second doped region covering a top surface and a side surface of said first doped region and not covering a bottom surface of said first doped region and each cell being electrically separated from adjacent cells by a vertical trench;
  c. interconnects located in the trenches, below the light receiving surface of the cells and contacting oppositely doped regions of adjacent cells; and
  d. external electrical contacts.

2. The device of claim 1 wherein the substrate is a high electrical resistivity material selected from the group consisting of inorganic oxides, carbides, nitrides, borides, silicates and mixtures thereof and having a resistivity greater than 500 ohm-centimeter.

3. The device of claim 2 including an electrically conducting barrier layer located between the substrate and the solar cells.

4. The device of claim 2 wherein the solar cells comprise semiconductor regions of opposite conductivity types wherein a first conductivity type region is located adjacent the substrate, a second conductivity type region covering the surface of the first region forming a horizontal photovoltaic junction therebetween which is parallel to the plane of the substrate and normal to the light receiving surfaces of the cells, and wherein the second region further covers a side of each cell such that a vertical junction is formed and the sides of adjacent cells are of opposite conductivity type.

5. The device of claim 2 wherein each trench extends to the substrate such that the substrate comprises the base of the trench.

6. The device of claim 1 including a barrier layer located between the substrate and solar cells.

7. The device of claim 6 wherein the substrate is an electrically conductive material and the barrier layer is an electrical insulator.

8. The device of claim 6 wherein the substrate is textured to provide for diffuse reflection of light and optical confinement.

9. The device of claim 6 wherein the barrier layer is selected to prevent diffusion of impurities between the substrate and the semiconductor.

10. The device of claim 6 wherein the barrier layer is reflective.

11. The device of claim 6 wherein the barrier layer is selected to minimize back surface recombination in the solar cell.

12. The device of claim 6 wherein the barrier layer is an insulating material selected from the group consisting of silicon dioxide, silicon nitride, and aluminum oxide.

13. The device of claim 6 wherein the barrier layer includes at least two layers comprising a first barrier layer selected from the group consisting of titanium diboride, titanium dioxide, and aluminum oxide and a second barrier layer of silicon dioxide.

14. The device of claim 6 wherein the surface of the barrier layer is textured to provide for diffuse reflection of light and optical confinement.

15. The device of claim 6 wherein the solar cells comprise semiconductor regions of opposite conductivity types wherein a first conductivity type region is located adjacent the barrier layer, a second conductivity type region covering the surface of the first region forming a horizontal photovoltaic junction therebetween which is parallel to the plane of the substrate and normal to the light receiving surfaces of the cells, and wherein the second region further covers a side of each cell such that a vertical junction is formed and the sides of adjacent cells are of opposite conductivity type.

16. The device of claim 15 wherein the semiconductor material is silicon and the junction is a homojunction.

17. The device of claim 15 wherein the semiconductor is polycrystalline silicon between 5 microns and 200 microns thick.

18. The device of claim 15 wherein the first conductivity region is p-type silicon and the second conductivity region is n-type silicon.

19. The device of claim 1 wherein each vertical trench is parallel to the other trenches.

20. The device of claim 19 wherein the trenches are equally spaced from the others.

21. The device of claim 1 wherein the interconnects are comprised of a conducting material selected from the group consisting of aluminum, nickel, palladium, silver, and titanium.

22. The device of claim 21 wherein the conducting material is silver.

23. The device of claim 1 wherein the interconnect is located continuously within each trench.

24. The device of claim 1 wherein the interconnect is located at intervals within each trench.

25. The device of claim 1 wherein the external contacts are located on opposing sides of the submodule.

26. The device of claim 1 wherein the external contacts wrap around from opposing sides and to the back of the submodule.

27. The device of claim 1 wherein the external contacts are comprised of a conducting material selected from the group consisting of aluminum, nickel, palladium, silver, and titanium.

28. The device of claim 27 wherein the conducting material is silver.

29. The device of claim 1 wherein a plurality of submodules are connected in electrical parallel to form a photovoltaic module.

30. A photovoltaic device having solar cells which are electrically series connected to form a monolithically interconnected submodule, comprising:
   a. an electrically insulating ceramic substrate containing a patterned array of a plurality of electrically conductive regions intersecting the upper surface of the substrate which function as interconnects between the solar cells;
   a patterned barrier layer formed over the substrate;
   c. a plurality of solar cells formed over the barrier layer, each cell having a light receiving surface and comprising oppositely doped regions of semiconductor materials which includes a first doped region of semiconductor material and a second doped region of semiconductor material doped oppositely to said first doped region, said second doped region covering a top surface and extending through an interior of said first doped region and not covering a bottom surface of said first doped region and each cell being electrically separated from adjacent cells by a vertical trench;
   d. a plurality of contact regions in selective electrical communication between oppositely doped regions of adjacent cells; and
   e. external electrical contacts.

31. The device of claim 30 wherein a plurality of submodules are connected in electrical parallel to form a photovoltaic module.

* * * * *